United States Patent
Wang

(10) Patent No.: US 8,564,363 B1
(45) Date of Patent: Oct. 22, 2013

(54) PULSE FILTER AND BRIDGE DRIVER USING THE SAME

(75) Inventor: Yen-Ping Wang, Taipei (TW)

(73) Assignee: Alitek Technology Corp., Taipei (TW)

( * ) Notice: Subject to any disclaimer, the term of this patent is extended or adjusted under 35 U.S.C. 154(b) by 0 days.

(21) Appl. No.: 13/546,104

(22) Filed: Jul. 11, 2012

(51) Int. Cl.
*H03K 5/00* (2006.01)

(52) U.S. Cl.
USPC .......................... 327/552; 327/333; 327/108

(58) Field of Classification Search
USPC .......................... 327/551–559, 108, 306, 333
See application file for complete search history.

(56) References Cited

U.S. PATENT DOCUMENTS

| | | | |
|---|---|---|---|
| 6,353,345 B1 * | 3/2002 | Yushan et al. | 327/112 |
| 7,425,864 B2 * | 9/2008 | Risbo | 330/10 |
| 7,671,638 B2 * | 3/2010 | Giandalia et al. | 327/108 |
| 7,719,325 B1 * | 5/2010 | Wang et al. | 327/112 |

* cited by examiner

*Primary Examiner* — Dinh T. Le
(74) *Attorney, Agent, or Firm* — The Weintraub Group, P.L.C.

(57) ABSTRACT

A pulse filter and a bridge driver using the same, the pulse filter including: a first NMOS transistor, having a drain coupled to a first PMOS transistor for providing a reset signal, a gate coupled to a second reset signal, and a source coupled to a second set signal; a second NMOS transistor, having a drain coupled to a second PMOS transistor for providing a set signal, a gate coupled to the second set signal, and a source coupled to the second reset signal; a third NMOS transistor, having a drain coupled to the second set signal, a gate coupled to the second reset signal, and a source coupled to a second power line; and a fourth NMOS transistor, having a drain coupled to the second reset signal, a gate coupled to the second set signal, and a source coupled to the second power line.

8 Claims, 5 Drawing Sheets

US 8,564,363 B1

PULSE FILTER AND BRIDGE DRIVER USING THE SAME

BACKGROUND OF THE INVENTION

1. Field of the Invention

The present invention relates to a pulse filter, and more particularly to a pulse filter in a half-bridge or full-bridge driver.

2. Description of the Related Art

To describe the related art of the present invention, the relation between a pulse filter and a half-bridge or full-bridge driver shall be introduced first. Please refer to FIG. 1, which shows the architecture of a typical half-bridge driver 100. As shown in FIG. 1, the typical half-bridge driver 100 at least includes a pulse generator 101, a level shifter 102, a pulse filter 103, and a latch 104.

The pulse generator 101 is used for generating a first clock signal CLK and a second clock signal CLKB, wherein the first clock signal CLK is interleaved with the second clock signal CLKB. The level shifter 102 is used to up shift the first clock signal CLK and the second clock signal CLKB from low side to provide counterpart signals for the pulse filter 103 at high side. The pulse filter 103 is used for cancelling a common-mode glitch interference accompanying the power lines of $V_{BOOT}$ and HB, and generating a set signal $v_{SET}$ and a reset signal $v_{RESET}$ to the latch 104. The latch 104 is used for sending a signal to a driver to switch a high-side power MOSFET. During the switching, a glitch is generated due to the capacitive characteristic of a capacitor $C_{BOOT}$, i.e., the voltage difference hold between the two plates of a capacitor will not change abruptly. As a result, a certain period the capacitor takes to reach a stable state causes a glitch period. The pulse filter 103 is therefore used to deal with the glitch problem to prevent false triggering of the latch 104.

Please refer to FIG. 2, which shows a circuit diagram of a prior art pulse filter 200 driving a latch 210. As shown in FIG. 2, the prior art pulse filter 200 includes PMOS transistors 201-204, and resistors 205-208.

When $V_S$ is at a low level and $V_R$ is at a high level, the PMOS transistors 201 and 203 will be turned off and the PMOS transistors 202 and 204 will be turned on, and the set signal $V_{SET}$ will be at a low level, and the reset signal $V_{RESET}$ will be at a high level. When $V_S$ is at a high level and $V_R$ is at a low level, the PMOS transistors 201 and 203 will be turned on and the PMOS transistors 202 and 204 will be turned off, and the set signal $V_{SET}$ will be at a high level, and the reset signal $V_{RESET}$ will be at a low level.

When a glitch couples on both the set signal $V_{SET}$ and the reset signal $V_{RESET}$, both the PMOS transistors 203 and 204 will remain in their previous conduction states—(on, off) or (off, on)—because their source-gate voltages will remain unchanged (if both $V_S$ and $V_R$ experience same voltage deviation).

However, as the resistors 205-206 and the resistors 207-208 can be mismatched due to manufacture process variations, $V_S$ and $V_R$ can experience different voltage deviations to cause false triggering of the latch 210. Besides, the PMOS transistors 201 and 202 can be broken down when a large common-mode glitch takes place on the power line $V_{BOOT}$ but the voltage deviations at the gates of the PMOS transistors 201 and 202 are relatively small due to low impedance values seen into the sources of the PMOS transistors 203 and 204.

Therefore, there is a demand to provide a robust pulse filter for a bridge driver.

SUMMARY OF THE INVENTION

One objective of the present invention is to provide an effective and robust pulse filter having a large noise margin for a bridge driver.

Another objective of the present invention is to provide a pulse filter capable of preventing false triggering of a latch at a high side for a bridge driver.

Still another objective of the present invention is to provide a pulse filter capable of preventing breakdown of PMOS transistors at high side for a bridge driver.

To achieve the foregoing objectives, the present invention provides a bridge driver, including:

a pulse generator, used for generating a first clock signal and a second clock signal, wherein the first clock signal is interleaved with the second clock signal;

a level shifter, used for up shifting the first clock signal and the second clock signal to provide a first set signal and a first reset signal;

a first Schmitt trigger circuit, powered by a first power line and a second power line, and having an input coupled to the first set signal, and an output for providing a second set signal by performing a first Schmitt trigger operation on the first set signal;

a first filter circuit, powered by the first power line and the second power line, and having an input coupled to the second set signal, and an output for providing a third set signal by performing a first low pass filtering operation on the second set signal;

a second Schmitt trigger circuit, powered by the first power line $V_{BOOT}$ and the second power line, and having an input coupled to the first reset signal, and an output for providing a second reset signal by performing a second Schmitt trigger operation on the first set signal;

a second filter circuit, powered by the first power line and the second power line, and having an input coupled to the second reset signal, and an output for providing a third reset signal by performing a second low pass filtering operation on the second reset signal;

a first PMOS transistor, having a source coupled to the first power line, a gate coupled to the third reset signal, and a drain;

a second PMOS transistor, having a source coupled to the first power line, a gate coupled to the third set signal, and a drain;

a first NMOS transistor, having a drain coupled to the first PMOS transistor for providing a reset signal, a gate coupled to the third reset signal, and a source coupled to the third set signal;

a second NMOS transistor, having a drain coupled to the second PMOS transistor for providing a set signal, a gate coupled to the third set signal, and a source coupled to the third reset signal;

a third NMOS transistor, having a drain coupled to the third set signal, a gate coupled to the third reset signal, and a source coupled to the second power line;

a fourth NMOS transistor, having a drain coupled to the third reset signal, a gate coupled to the third set signal, and a source coupled to the second power line; and a latch, used for sending a signal to a driver to switch a high-side power MOSFET according to the set signal and the reset signal.

To make it easier for our examiner to understand the objective of the invention, its structure, innovative features, and performance, we use a preferred embodiment together with the attached drawings for the detailed description of the invention.

DETAILED DESCRIPTION OF THE PREFERRED EMBODIMENTS

The present invention will be described in more detail hereinafter with reference to the accompanying drawings that show the preferred embodiments of the invention.

Figure 1:
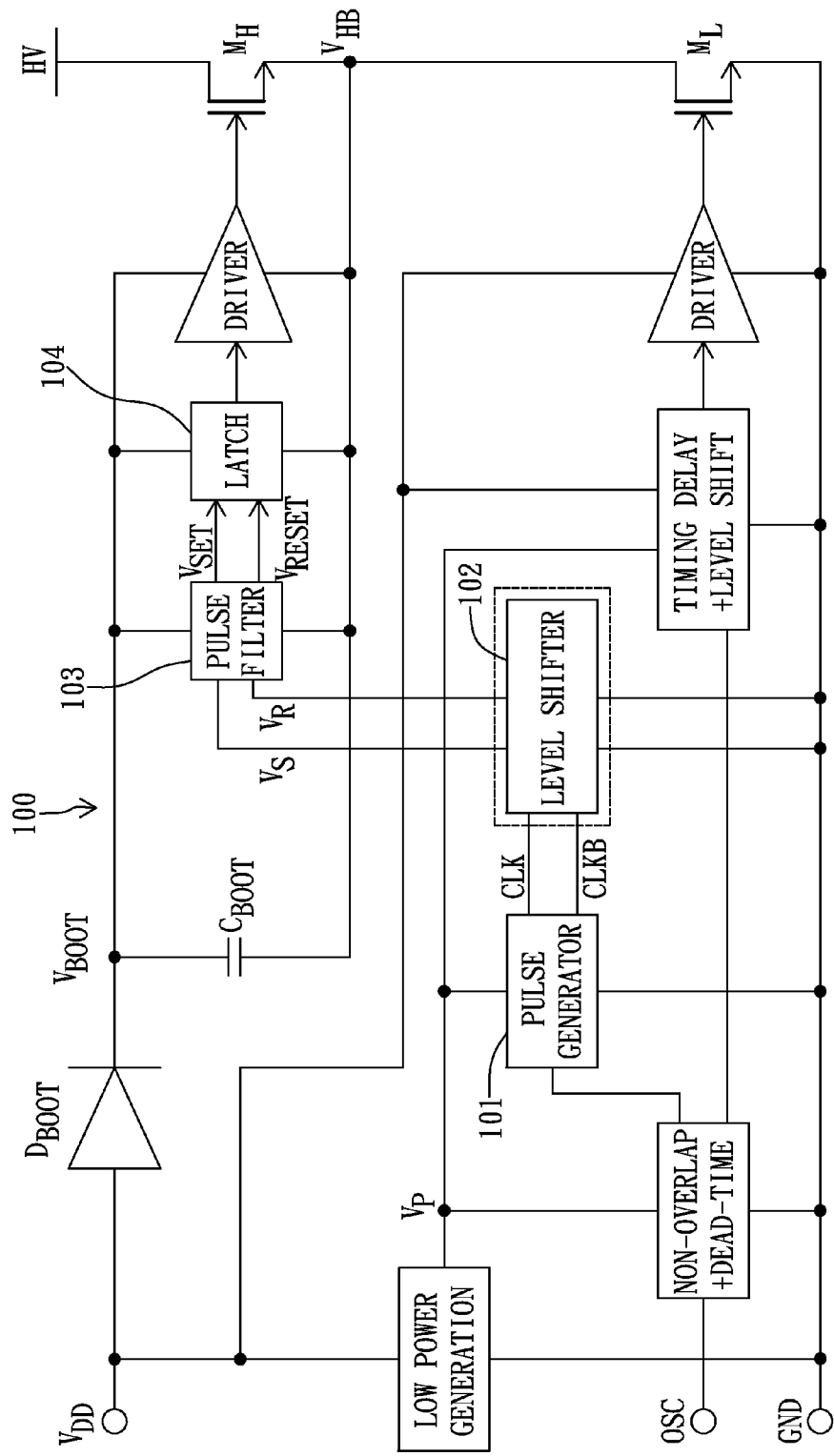
FIG. 1 shows the architecture of a typical half-bridge driver.
Figure 2:
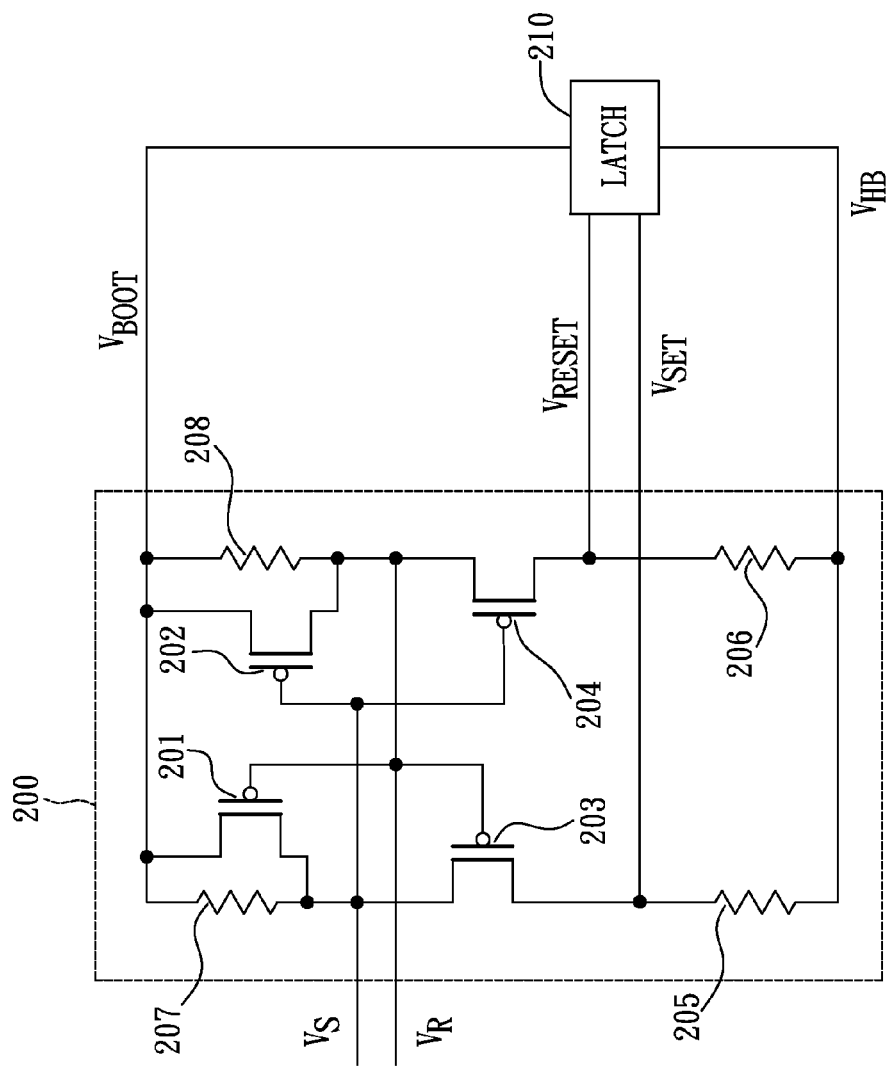
FIG. 2 shows a circuit diagram of a prior art pulse filter driving a latch.
Figure 3:
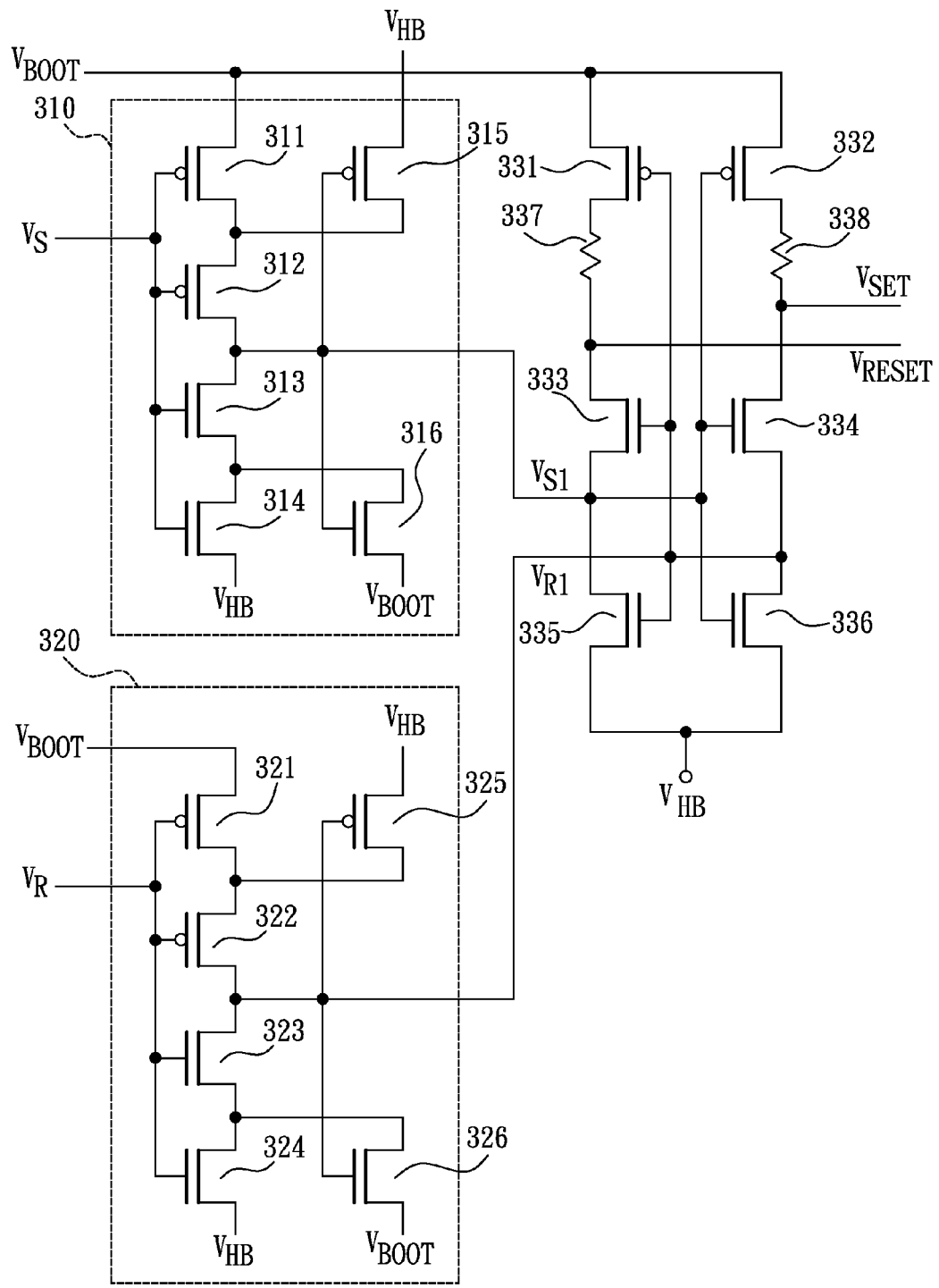
FIG. 3 illustrates a circuit diagram of a pulse filter according to a preferred embodiment of the present invention.

Please refer to FIG. 3, which illustrates a circuit diagram of a pulse filter according to a preferred embodiment of the present invention. As illustrated in FIG. 3, the pulse filter includes a first Schmitt trigger circuit 310, a second Schmitt trigger circuit 320, a first PMOS transistor 331, a second PMOS transistor 332, a first NMOS transistor 333, a second NMOS transistor 334, a third NMOS transistor 335, a fourth NMOS transistor 336, and resistors 337-338.

The first Schmitt trigger circuit 310, including a third PMOS transistor 311, a fourth PMOS transistor 312, a fifth NMOS transistor 313, a sixth NMOS transistor 314, a fifth PMOS transistor 315, and a seventh NMOS transistor 316, has an input coupled to a first set signal $V_S$, and an output for providing a second set signal $V_{S1}$ by performing a first Schmitt trigger operation on the first set signal $V_S$.

The third PMOS transistor 311 has a source coupled to a first power line $V_{BOOT}$, a gate coupled to the first set signal $V_S$, and a drain coupled to the fourth PMOS transistor 312. The fourth PMOS transistor 312 has a source coupled to the drain of the third PMOS transistor 311, a gate coupled to the first set signal $V_S$, and a drain coupled to the fifth NMOS transistor 313 for providing the second set signal $V_{S1}$. The fifth NMOS transistor 313 has a drain coupled to the drain of the fourth PMOS transistor 312, a gate coupled to the first set signal $V_S$, and a source coupled to the sixth NMOS transistor 314. The sixth NMOS transistor 314 has a drain coupled to the source of the fifth NMOS transistor 313, a gate coupled to the first set signal $V_S$, and a source coupled to a second power line $V_{HB}$. The fifth PMOS transistor 315 has a source coupled to the second power line $V_{HB}$, a gate coupled to the drain of the fourth PMOS transistor 312, and a drain coupled to the source of the fourth PMOS transistor 312. The seventh NMOS transistor 316 has a drain coupled to the source of the fifth NMOS transistor 313, a gate coupled to the drain of the fourth PMOS transistor 312, and a source coupled to the first power line $V_{BOOT}$.

The operation principle of the first Schmitt trigger circuit 310 is explained as follows:

When the second set signal $V_{S1}$ is at a high level with the third PMOS transistor 311 and the fourth PMOS transistor 312 being turned on, and the fifth NMOS transistor 313 and the sixth NMOS transistor 314 being turned off, the seventh NMOS transistor 316 will be turned on and the source of the fifth NMOS transistor 313 will be biased by a high voltage around $V_{BOOT}$. As a result, the fifth NMOS transistor 313 can be effectively prevented from being falsely turned on when the first set signal $V_S$ exhibits a positive glitch from a low level—as long as the positive glitch does not exceed a corresponding threshold set by the high voltage at the source of the fifth NMOS transistor 313.

When the second set signal $V_{S1}$ is at a low level with the third PMOS transistor 311 and the fourth PMOS transistor 312 being turned off, and the fifth NMOS transistor 313 and the sixth NMOS transistor 314 being turned on, the fifth PMOS transistor 315 will be turned on and the source of the fourth PMOS transistor 312 will be biased by a low voltage around $V_{HB}$. As a result, the fourth PMOS transistor 312 can be effectively prevented from being falsely turned on when the first set signal $V_S$ exhibits a negative glitch from a high level—as long as the negative glitch does not fall below a corresponding threshold set by the low voltage at the source of the fourth PMOS transistor 312.

The second Schmitt trigger circuit 320, including a sixth PMOS transistor 321, a seventh PMOS transistor 322, an eighth NMOS transistor 323, a ninth NMOS transistor 324, an eighth PMOS transistor 325, and a tenth NMOS transistor 326, has an input coupled to a first reset signal $V_R$, and an output for providing a second reset signal $V_{R1}$ by performing a second Schmitt trigger operation on the first reset signal $V_R$.

The sixth PMOS transistor 321 has a source coupled to the first power line $V_{BOOT}$, a gate coupled to the first reset signal $V_R$, and a drain coupled to the seventh PMOS transistor 322. The seventh PMOS transistor 322 has a source coupled to the drain of the sixth PMOS transistor 321, a gate coupled to the first reset signal $V_R$, and a drain coupled to the eighth NMOS transistor 323 for providing the second reset signal $V_{R1}$. The eighth NMOS transistor 323 has a drain coupled to the drain of the seventh PMOS transistor 322, a gate coupled to the first reset signal $V_R$, and a source coupled to the ninth NMOS transistor 324. The ninth NMOS transistor 324 has a drain coupled to the source of the eighth NMOS transistor 323, a gate coupled to the first reset signal $V_R$, and a source coupled to the second power line $V_{HB}$. The eighth PMOS transistor 325 has a source coupled to the second power line $V_{HB}$, a gate coupled to the drain of the seventh PMOS transistor 322, and a drain coupled to the source of the seventh PMOS transistor 322. The tenth NMOS transistor 326 has a drain coupled to the source of the eighth NMOS transistor 323, a gate coupled to the drain of the seventh PMOS transistor 322, and a source coupled to the first power line $V_{BOOT}$.

As the operation principle of the second Schmitt trigger circuit 320 is same as that of the first Schmitt trigger circuit 310, it will not be readdressed here.

The first PMOS transistor 331 has a source coupled to the first power line $V_{BOOT}$, a gate coupled to the second reset signal $V_{R1}$, and a drain coupled to the resistor 337.

The second PMOS transistor 332 has a source coupled to the first power line $V_{BOOT}$, a gate coupled to the second set signal $V_{S1}$, and a drain coupled to the resistor 338.

The first NMOS transistor 333 has a drain coupled to the resistor 337 for providing a reset signal $V_{RESET}$, a gate coupled to the second reset signal $V_{R1}$, and a source coupled to the second set signal $V_{S1}$.

The second NMOS transistor 334 has a drain coupled to the resistor 338 for providing a set signal $V_{SET}$, a gate coupled to the second set signal $V_{S1}$, and a source coupled to the second reset signal $V_{R1}$.

The third NMOS transistor 335 has a drain coupled to the second set signal $V_{S1}$, a gate coupled to the second reset signal $V_{R1}$, and a source coupled to the second power line $V_{HB}$.

The fourth NMOS transistor 336 has a drain coupled to the second reset signal $V_{R1}$, a gate coupled to the second set signal $V_{S1}$, and a source coupled to the second power line $V_{HB}$.

The resistors 337-338 are optional components and can be replaced with short circuits.

When the second reset signal $V_{R1}$ is at a low level, and the second set signal $V_{S1}$ is at a high level, the first PMOS transistor 331 will be turned on, the first NMOS transistor 333 and the third NMOS transistor 335 will be turned off, the second PMOS transistor 332 will be turned off, and the second NMOS transistor 334 and the fourth NMOS transistor 336 will be turned on, so that the set signal $V_{SET}$ will be at a low level, and the reset signal $V_{RESET}$ will be at a high level. If the second reset signal $V_{R1}$ is coupled with a positive glitch, the reset signal $V_{RESET}$ will remain at a high level due to a fact that the first NMOS transistor 333 is still off—because the source of the first NMOS transistor 333 is biased by a high level of the second set signal $V_{S1}$.

When the second reset signal $V_{R1}$ is at a high level, and the second set signal $V_{S1}$ is at a low level, the first PMOS transistor 331 will be turned off, the first NMOS transistor 333 and the third NMOS transistor 335 will be turned on, the second PMOS transistor 332 will be turned on, and the second NMOS transistor 334 and the fourth NMOS transistor 336 will be turned off, so that the set signal $V_{SET}$ will be at a high level, and the reset signal $V_{RESET}$ will be at a low level. If the second set signal $V_{S1}$ is coupled with a positive glitch, the set signal $V_{SET}$ will remain at a high level due to a fact that the second NMOS transistor 334 is still off—because the source of the second NMOS transistor 334 is biased by a high level of the second reset signal $V_{R1}$.

As a result, the false triggering of a latch driven by the set signal $V_{SET}$ and the reset signal $V_{RESET}$ can be avoided. Besides, as the cascoded structure of the first NMOS transistor 333, the second NMOS transistor 334, the third NMOS transistor 335, and the fourth NMOS transistor 336 can provide a much larger output impedance than the first PMOS transistor 331 and the second PMOS transistor 332, the first PMOS transistor 331 and the second PMOS transistor 332 can therefore be effectively protected from getting breakdown.

Figure 4:
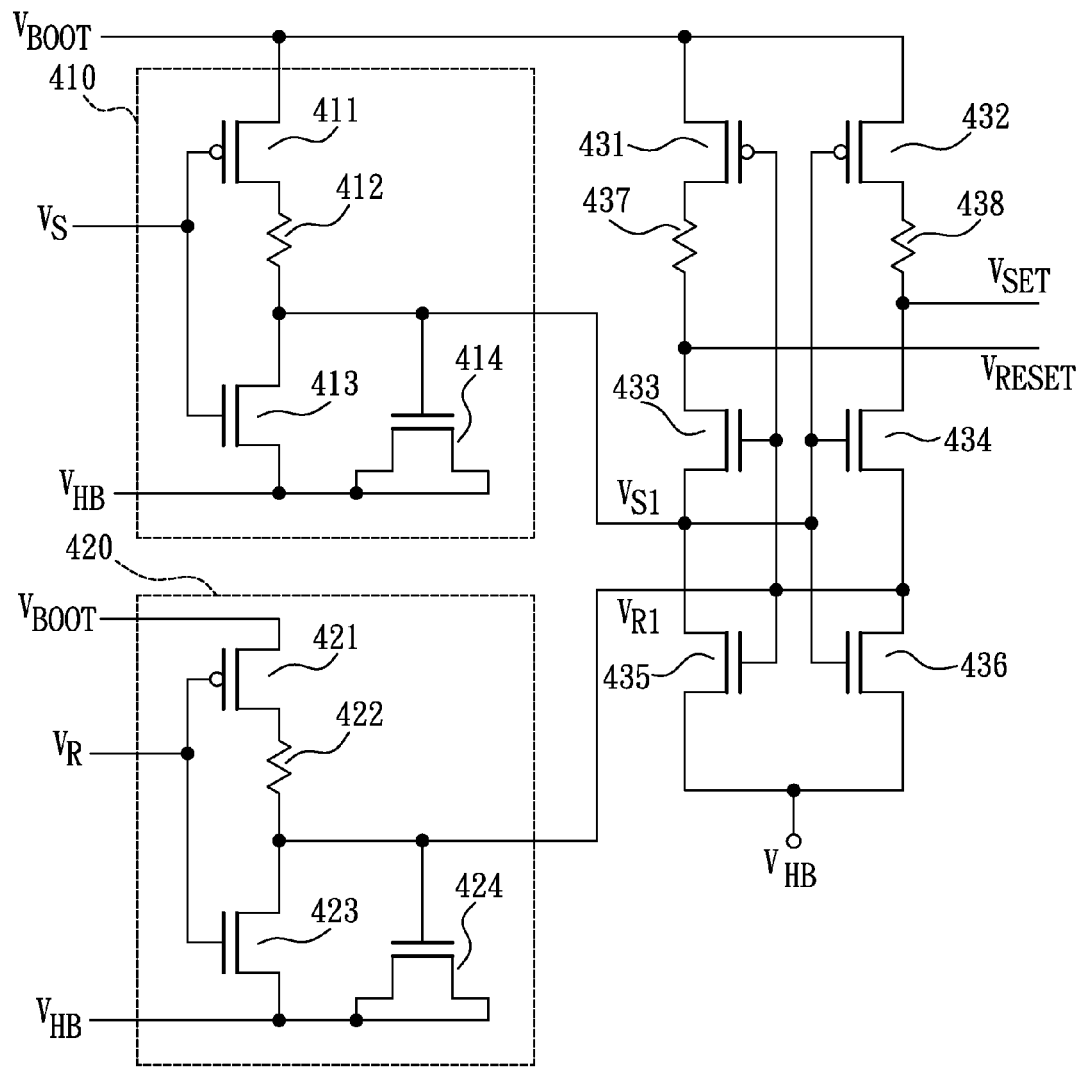
FIG. 4 illustrates a circuit diagram of a pulse filter according to another preferred embodiment of the present invention.

Please refer to FIG. 4, which illustrates a circuit diagram of a pulse filter according to another preferred embodiment of the present invention. As illustrated in FIG. 4, the pulse filter includes a first filter circuit 410, a second filter circuit 420, a first PMOS transistor 431, a second PMOS transistor 432, a first NMOS transistor 433, a second NMOS transistor 434, a third NMOS transistor 435, a fourth NMOS transistor 436, and resistors 437-438.

The first filter circuit 410, including a third PMOS transistor 411, a resistor 412, a fifth NMOS transistor 413, and a sixth NMOS transistor 414, has an input coupled to a first set signal $V_S$, and an output for providing a second set signal $V_{S1}$ by performing a first low pass filtering operation on the first set signal $V_S$.

The third PMOS transistor 411 has a source coupled to a first power line $V_{BOOT}$, a gate coupled to the first set signal $V_S$, and a drain coupled to the resistor 412.

The resistor 412 is an optional component—can be replaced with a short circuit—coupled between the third PMOS transistor 411 and the fifth NMOS transistor 413.

The fifth NMOS transistor 413 has a drain coupled to the resistor 412 for providing the second set signal $V_{S1}$, a gate coupled to the first set signal $V_S$, and a source coupled to a second power line $V_{HB}$.

The sixth NMOS transistor 414, having a drain and a source both coupled to the second power line $V_{HB}$, and a gate coupled to the drain of the fifth NMOS transistor 413, is used as a capacitor to facilitate a low pass filtering effect within the first filter circuit 410.

Thanks to the first low pass filtering effect, the first filter circuit 410 can possess a larger noise margin.

The second filter circuit 420, including a fourth PMOS transistor 421, a resistor 422, a seventh NMOS transistor 423, and an eighth NMOS transistor 424, has an input coupled to a first reset signal $V_R$, and an output for providing a second reset signal $V_{R1}$ by performing a second low pass filtering operation on the first reset signal $V_R$.

The fourth PMOS transistor 421 has a source coupled to the first power line $V_{BOOT}$, a gate coupled to the first reset signal $V_R$, and a drain coupled to the resistor 422.

The resistor 422 is an optional component—can be replaced with a short circuit—coupled between the fourth PMOS transistor 421 and the seventh NMOS transistor 423.

The seventh NMOS transistor 423 has a drain coupled to the resistor 422 for providing the second reset signal $V_{R1}$, a gate coupled to the first reset signal $V_R$, and a source coupled to the second power line $V_{HB}$.

The eighth NMOS transistor 424, having a drain and a source both coupled to the second power line $V_{HB}$, and a gate coupled to the drain of the seventh NMOS transistor 423, is used as a capacitor to facilitate a low pass filtering effect within the second filter circuit 420.

Thanks to the second low pass filtering effect, the second filter circuit 420 can possess a larger noise margin.

The first PMOS transistor 431 has a source coupled to the first power line $V_{BOOT}$, a gate coupled to the second reset signal $V_{R1}$, and a drain coupled to the resistor 437.

The second PMOS transistor 432 has a source coupled to the first power line $V_{BOOT}$, a gate coupled to the second set signal $V_{S1}$, and a drain coupled to the resistor 438.

The first NMOS transistor 433 has a drain coupled to the resistor 437 for providing a reset signal $V_{RESET}$, a gate coupled to the second reset signal $V_{R1}$, and a source coupled to the second set signal $V_{S1}$.

The second NMOS transistor 434 has a drain coupled to the resistor 438 for providing a set signal $V_{SET}$, a gate coupled to the second set signal $V_{S1}$, and a source coupled to the second reset signal $V_{R1}$.

The third NMOS transistor 435 has a drain coupled to the second set signal $V_{S1}$, a gate coupled to the second reset signal $V_{R1}$, and a source coupled to the second power line $V_{HB}$.

The fourth NMOS transistor 436 has a drain coupled to the second reset signal $V_{R1}$, a gate coupled to the second set signal $V_{S1}$, and a source coupled to the second power line $V_{HB}$.

The resistors 437-438 are optional components and can be replaced with short circuits.

When the second reset signal $V_{R1}$ is at a low level, and the second set signal $V_{S1}$ is at a high level, the first PMOS transistor 431 will be turned on, the first NMOS transistor 433 and the third NMOS transistor 435 will be turned off, the second PMOS transistor 432 will be turned off, and the second NMOS transistor 434 and the fourth NMOS transistor 436 will be turned on, so that the set signal $V_{SET}$ will be at a low level, and the reset signal $V_{RESET}$ will be at a high level. If the second reset signal $V_{R1}$ is coupled with a positive glitch, the reset signal $V_{RESET}$ will remain at a high level due to a fact that the first NMOS transistor 433 is still off—because the source of the first NMOS transistor 433 is biased by a high level of the second set signal $V_{S1}$.

When the second reset signal $V_{R1}$ is at a high level, and the second set signal $V_{S1}$ is at a low level, the first PMOS transistor 431 will be turned off, the first NMOS transistor 433 and the third NMOS transistor 435 will be turned on, the second PMOS transistor 432 will be turned on, and the second NMOS transistor 434 and the fourth NMOS transistor 436 will be turned off, so that the set signal $V_{SET}$ will be at a high level, and the reset signal $V_{RESET}$ will be at a low level. If the second set signal $V_{S1}$ is coupled with a positive glitch, the set signal $V_{SET}$ will remain at a high level due to a fact that the second NMOS transistor 434 is still off—because the source of the second NMOS transistor 434 is biased by a high level of the second reset signal $V_{R1}$.

As a result, the false triggering of a latch driven by the set signal $V_{SET}$ and the reset signal $V_{RESET}$ can be avoided. Besides, as the cascoded structure of the first NMOS transistor 433, the second NMOS transistor 434, the third NMOS transistor 435, and the fourth NMOS transistor 436 can provide a much larger output impedance than the first PMOS transistor 431 and the second PMOS transistor 432, the first PMOS transistor 431 and the second PMOS transistor 432 can therefore be effectively protected from getting breakdown.

Figure 5:
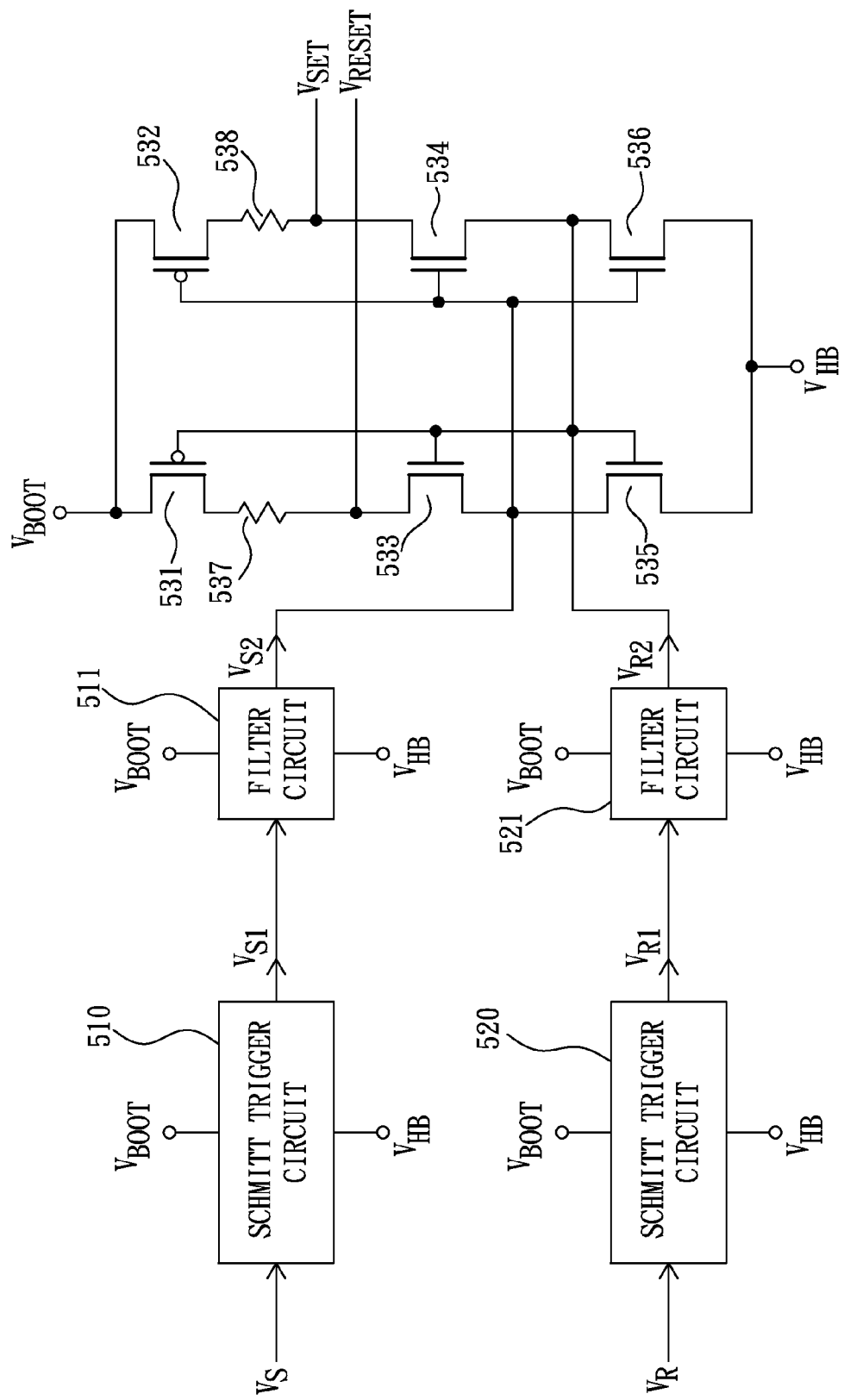
FIG. 5 illustrates a block diagram of a pulse filter according to still another preferred embodiment of the present invention.

Please refer to FIG. 5, which illustrates a block diagram of a pulse filter according to still another preferred embodiment of the present invention. As illustrated in FIG. 5, the pulse filter includes a first Schmitt trigger circuit 510, a first filter circuit 511, a second Schmitt trigger circuit 520, a second filter circuit 521, a first PMOS transistor 531, a second PMOS transistor 532, a first NMOS transistor 533, a second NMOS transistor 534, a third NMOS transistor 535, a fourth NMOS transistor 536, and resistors 537-538.

The first Schmitt trigger circuit 510, powered by a first power line $V_{BOOT}$ and a second power line $V_{HB}$, has an input coupled to a first set signal $V_S$, and an output for providing a second set signal $V_{S1}$ by performing a first Schmitt trigger operation on the first set signal $V_S$. As the principle of the Schmitt trigger operation has been specified above, it will not be readdressed here.

The first filter circuit 511, powered by the first power line $V_{BOOT}$ and the second power line $V_{HB}$, has an input coupled to the second set signal $V_{S1}$, and an output for providing a third set signal $V_{S2}$ by performing a first low pass filtering operation on the second set signal $V_{S1}$. As the principle of the low pass filtering operation has been specified above, it will not be readdressed here.

The second Schmitt trigger circuit 520, powered by the first power line $V_{BOOT}$ and the second power line $V_{HB}$, has an input coupled to a first reset signal $V_R$, and an output for providing a second reset signal $V_{R1}$ by performing a second Schmitt trigger operation on the first reset signal $V_R$.

The second filter circuit 521, powered by the first power line $V_{BOOT}$ and the second power line $V_{HB}$, has an input coupled to the second reset signal $V_{R1}$, and an output for providing a third reset signal $V_{R2}$ by performing a second low pass filtering operation on the second reset signal $V_{R1}$.

The first PMOS transistor 531 has a source coupled to the first power line $V_{BOOT}$, a gate coupled to the third reset signal $V_{R2}$, and a drain coupled to the resistor 537.

The second PMOS transistor 532 has a source coupled to the first power line $V_{BOOT}$, a gate coupled to the third set signal $V_{S2}$, and a drain coupled to the resistor 538.

The first NMOS transistor 533 has a drain coupled to the resistor 537 for providing a reset signal $V_{RESET}$, a gate coupled to the third reset signal $V_{R2}$, and a source coupled to the third set signal $V_{S2}$.

The second NMOS transistor 534 has a drain coupled to the resistor 538 for providing a set signal $V_{SET}$, a gate coupled to the third set signal $V_{S2}$, and a source coupled to the third reset signal $V_{R2}$.

The third NMOS transistor 535 has a drain coupled to the third set signal $V_{S2}$, a gate coupled to the third reset signal $V_{R2}$, and a source coupled to the second power line $V_{HB}$.

The fourth NMOS transistor 536 has a drain coupled to the third reset signal $V_{R2}$, a gate coupled to the third set signal $V_{S2}$, and a source coupled to the second power line $V_{HB}$.

The resistors 537-538 are optional components and can be replaced with short circuits.

When the third reset signal $V_{R2}$ is at a low level, and the third set signal $V_{S2}$ is at a high level, the first PMOS transistor 531 will be turned on, the first NMOS transistor 533 and the third NMOS transistor 535 will be turned off, the second PMOS transistor 532 will be turned off, and the second NMOS transistor 534 and the fourth NMOS transistor 536 will be turned on, so that the set signal $V_{SET}$ will be at a low level, and the reset signal $V_{RESET}$ will be at a high level. If the third reset signal $V_{R2}$ is coupled with a positive glitch, the reset signal $V_{RESET}$ will remain at a high level due to a fact that the first NMOS transistor 533 is still off—because the source of the first NMOS transistor 533 is biased by a high level of the third set signal $V_{S2}$.

When the third reset signal $V_{R2}$ is at a high level, and the third set signal $V_{S2}$ is at a low level, the first PMOS transistor 531 will be turned off, the first NMOS transistor 533 and the third NMOS transistor 535 will be turned on, the second PMOS transistor 532 will be turned on, and the second NMOS transistor 534 and the fourth NMOS transistor 536 will be turned off, so that the set signal $V_{SET}$ will be at a high level, and the reset signal $V_{RESET}$ will be at a low level. If the third set signal $V_{S2}$ is coupled with a positive glitch, the set signal $V_{SET}$ will remain at a high level due to a fact that the second NMOS transistor 534 is still off—because the source of the second NMOS transistor 534 is biased by a high level of the third reset signal $V_{R2}$.

As a result, the false triggering of a latch driven by the set signal $V_{SET}$ and the reset signal $V_{RESET}$ can be avoided. Besides, as the cascoded structure of the first NMOS transistor 533, the second NMOS transistor 534, the third NMOS transistor 535, and the fourth NMOS transistor 536 can provide a much larger output impedance than the first PMOS transistor 531 and the second PMOS transistor 532, the first PMOS transistor 531 and the second PMOS transistor 532 can therefore be effectively protected from getting breakdown.

In conclusion, the pulse filter of the present invention can have a large noise margin, prevent false triggering of a latch, and prevent breakdown of PMOS transistors at a high side.

While the invention has been described by way of examples and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. A pulse filter, used in a half-bridge or full-bridge driver, said pulse filter comprising:
   a first Schmitt trigger circuit, having an input coupled to a first set signal, and an output for providing a second set signal by performing a first Schmitt trigger operation on said first set signal;
   a second Schmitt trigger circuit, having an input coupled to a first reset signal, and an output for providing a second reset signal by performing a second Schmitt trigger operation on said first reset signal;

a first PMOS transistor, having a source coupled to a first power line, a gate coupled to said second reset signal, and a drain;

a second PMOS transistor, having a source coupled to said first power line, a gate coupled to said second set signal, and a drain;

a first NMOS transistor, having a drain coupled to said drain of said first PMOS transistor for providing a reset signal, a gate coupled to said second reset signal, and a source coupled to said second set signal;

a second NMOS transistor, having a drain coupled to said drain of said second PMOS transistor for providing a set signal, a gate coupled to said second set signal, and a source coupled to said second reset signal;

a third NMOS transistor, having a drain coupled to said second set signal, a gate coupled to said second reset signal, and a source coupled to a second power line; and a fourth NMOS transistor, having a drain coupled to said second reset signal, a gate coupled to said second set signal, and a source coupled to said second power line.

2. The pulse filter as claim 1, wherein said first Schmitt trigger circuit comprises:
  a third PMOS transistor, having a source coupled to said first power line, a gate coupled to said first set signal, and a drain;
  a fourth PMOS transistor, having a source coupled to said drain of said third PMOS transistor, a gate coupled to said first set signal, and a drain for providing said second set signal;
  a fifth NMOS transistor, having a drain coupled to said drain of said fourth PMOS transistor, a gate coupled to said first set signal, and a source;
  a sixth NMOS transistor, having a drain coupled to said source of said fifth NMOS transistor, a gate coupled to said first set signal, and a source coupled to said second power line;
  a fifth PMOS transistor, having a source coupled to said second power line, a gate coupled to said drain of said fourth PMOS transistor, and a drain coupled to said source of said fourth PMOS transistor; and
  a seventh NMOS transistor, having a drain coupled to said source of said fifth NMOS transistor, a gate coupled to said drain of said fourth PMOS transistor, and a source coupled to said first power line.

3. The pulse filter as claim 2, wherein said second Schmitt trigger circuit comprises:
  a sixth PMOS transistor, having a source coupled to said first power line, a gate coupled to said first reset signal, and a drain;
  a seventh PMOS transistor, having a source coupled to said drain of said sixth PMOS transistor, a gate coupled to said first reset signal, and a drain for providing said second reset signal;
  an eighth NMOS transistor, having a drain coupled to said drain of said seventh PMOS transistor, a gate coupled to said first reset signal, and a source;
  a ninth NMOS transistor, having a drain coupled to said source of said eighth NMOS transistor, a gate coupled to said first reset signal, and a source coupled to said second power line;
  an eighth PMOS transistor, having a source coupled to said second power line, a gate coupled to said drain of said seventh PMOS transistor, and a drain coupled to said source of said seventh PMOS transistor; and a tenth NMOS transistor, having a drain coupled to said source of said eighth NMOS transistor, a gate coupled to said drain of said seventh PMOS transistor, and a source coupled to said first power line.

4. A pulse filter, used in a half-bridge or full-bridge driver, said pulse filter comprising:
  a first filter circuit, having an input coupled to a first set signal, and an output for providing a second set signal by performing a first low pass filtering operation on said first set signal;
  a second filter circuit, having an input coupled to a first reset signal, and an output for providing a second reset signal by performing a second low pass filtering operation on said first reset signal;
  a first PMOS transistor, having a source coupled to a first power line, a gate coupled to said second reset signal, and a drain;
  a second PMOS transistor, having a source coupled to said first power line, a gate coupled to said second set signal, and a drain;
  a first NMOS transistor, having a drain coupled to said drain of said first PMOS transistor for providing a reset signal, a gate coupled to said second reset signal, and a source coupled to said second set signal;
  a second NMOS transistor, having a drain coupled to said drain of said second PMOS transistor for providing a set signal, a gate coupled to said second set signal, and a source coupled to said second reset signal;
  a third NMOS transistor, having a drain coupled to said second set signal, a gate coupled to said second reset signal, and a source coupled to a second power line; and
  a fourth NMOS transistor, having a drain coupled to said second reset signal, a gate coupled to said second set signal, and a source coupled to said second power line.

5. The pulse filter as claim 4, wherein said first filter circuit comprises:
  a third PMOS transistor, having a source coupled to said first power line, a gate coupled to said first set signal, and a drain;
  a fifth NMOS transistor, having a drain providing said second set signal, a gate coupled to said first set signal, and a source coupled to said second power line; and
  a sixth NMOS transistor, having a drain and a source both coupled to said second power line, and a gate coupled to said drain of said fifth NMOS transistor.

6. The pulse filter as claim 5, wherein said second filter circuit comprises:
  a fourth PMOS transistor, having a source coupled to said first power line, a gate coupled to said first reset signal, and a drain;
  a seventh NMOS transistor, having a drain for providing said second reset signal, a gate coupled to said first reset signal, and a source coupled to said second power line; and
  an eighth NMOS transistor, having a drain and a source both coupled to said second power line, and a gate coupled to said drain of said seventh NMOS transistor.

7. A bridge driver, comprising:
  a pulse generator, used for generating a first clock signal and a second clock signal, wherein said first clock signal is interleaved with said second clock signal;
  a level shifter, used for up shifting said first clock signal and said second clock signal to provide a first set signal and a first reset signal;
  a first Schmitt trigger circuit, powered by a first power line and a second power line, and having an input coupled to said first set signal, and an output for providing a second set signal by performing a first Schmitt trigger operation on said first set signal;

a first filter circuit, powered by said first power line and said second power line, and having an input coupled to said second set signal, and an output for providing a third set signal by performing a first low pass filtering operation on said second set signal;

a second Schmitt trigger circuit, powered by said first power line $V_{BOOT}$ and said second power line, and having an input coupled to said first reset signal, and an output for providing a second reset signal by performing a second Schmitt trigger operation on said first set signal;

a second filter circuit, powered by said first power line and said second power line, and having an input coupled to said second reset signal, and an output for providing a third reset signal by performing a second low pass filtering operation on said second reset signal;

a first PMOS transistor, having a source coupled to said first power line, a gate coupled to said third reset signal, and a drain;

a second PMOS transistor, having a source coupled to said first power line, a gate coupled to said third set signal, and a drain;

a first NMOS transistor, having a drain coupled to said first PMOS transistor for providing a reset signal, a gate coupled to said third reset signal, and a source coupled to said third set signal;

a second NMOS transistor, having a drain coupled to said second PMOS transistor for providing a set signal, a gate coupled to said third set signal, and a source coupled to said third reset signal;

a third NMOS transistor, having a drain coupled to said third set signal, a gate coupled to said third reset signal, and a source coupled to said second power line;

a fourth NMOS transistor, having a drain coupled to said third reset signal, a gate coupled to said third set signal, and a source coupled to said second power line; and a latch, used for sending a signal to a driver to switch a high-side power MOSFET according to said set signal and said reset signal.

8. The bridge driver as claim 7, wherein said bridge driver is a half-bridge driver or a full-bridge driver.

\* \* \* \* \*